United States Patent [19]

Yoshimura

[11] Patent Number: 4,981,776

[45] Date of Patent: Jan. 1, 1991

[54] METHOD OF MANUFACTURING A PLASTIC ENCAPSULATED SEMICONDUCTOR DEVICE WITH INSULATED HEAT SINK

[75] Inventor: Yutaka Yoshimura, Hyogo, Japan

[73] Assignee: Tokyo Shibaura Denki Kabushiki Kaisha, Kawaski, Japan

[21] Appl. No.: 473,478

[22] Filed: Feb. 1, 1990

Related U.S. Application Data

[62] Division of Ser. No. 573,342, Feb. 24, 1984, Pat. No. 4,916,518.

[30] Foreign Application Priority Data

Jan. 25, 1983 [JP] Japan .................................. 58-9298

[51] Int. Cl.[5] ...................... H01L 21/56; H01L 21/60
[52] U.S. Cl. .................................... 437/207; 437/219; 437/214
[58] Field of Search ............... 437/207, 211, 219, 217, 437/224, 214

[56] References Cited

U.S. PATENT DOCUMENTS

| | | | |
|---|---|---|---|
| 3,629,672 | 12/1971 | Van de Water | 357/72 |
| 4,339,768 | 7/1982 | Keller et al. | 357/70 |
| 4,451,973 | 6/1984 | Tateno et al. | 437/207 |
| 4,459,607 | 7/1984 | Reid | 357/70 |
| 4,503,452 | 3/1985 | Yokozawa et al. | 357/72 |
| 4,916,518 | 4/1990 | Yoshimura et al. | 357/70 |

Primary Examiner—Olik Chaudhuri
Assistant Examiner—David E. Graybill
Attorney, Agent, or Firm—Finnegan, Henderson, Farabow, Garrett, and Dunner

[57] ABSTRACT

A semiconductor device has a lead frame. The lead frame has a mount portion and a lead portion. A semiconductor chip is mounted on one major surface of the mount portion of the lead frame. The semiconductor chip is connected by an electrical connecting means to the lead portion of the lead frame. An electrical insulating layer is formed on the other major surface of the mount portion of the lead frame. The mount portion, part of the lead portion of the lead frame, the semiconductor chip and the electrically connecting means, excluding the surface of the electrical insulating layer of the mount portion of the lead frame, are sealed or encapsulated by an electrical insulating member.

2 Claims, 4 Drawing Sheets

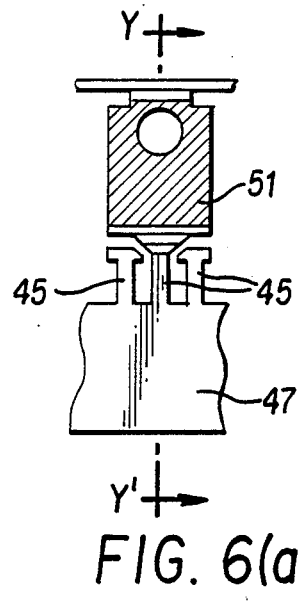
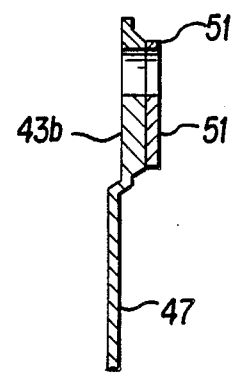
FIG. 6(a)
FIG. 6(b)
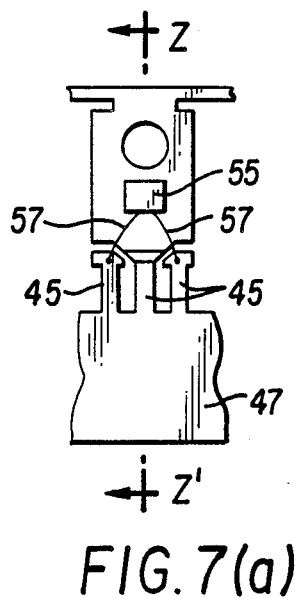
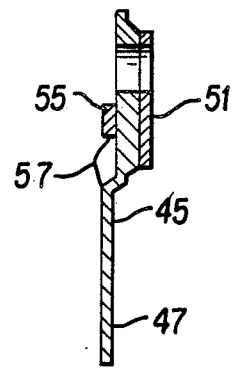
FIG. 7(a)
FIG. 7(b)

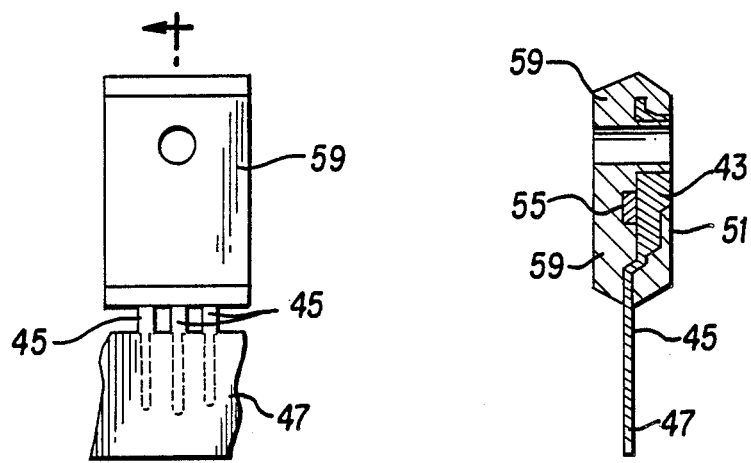
FIG. 8(a)
FIG. 8(b)
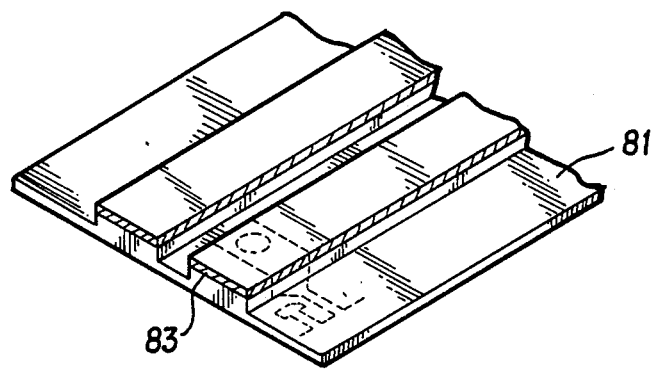
FIG. 9

4,981,776

METHOD OF MANUFACTURING A PLASTIC ENCAPSULATED SEMICONDUCTOR DEVICE WITH INSULATED HEAT SINK

This is a division of application Ser. No. 06/573,342, filed Feb. 24, 1984 Pat. No. 4,916,518.

BACKGROUND OF THE INVENTION

The present invention relates to an improvement of a plastic encapsulated semiconductor device and a method for manufacturing the same and, more particularly, to an improvement of an electrical insulating layer on a heat sink of the semiconductor device and a method for manufacturing the same.

Plastic encapsulated semiconductor devices such as power transistors, each of which has a heat sink, have long been commercially available. Plastic encapsulation in the manufacturing process of these semiconductor devices is performed as follows. FIG. 1 is a sectional view of a semi-finished semiconductor device to be plastic encapsulated and a device to plastic encapsulate it. Referring to FIG. 1, a lead frame 1 for the semiconductor device has a mount portion 3 and a lead portion 5. A semiconductor chip (pellet) 7 is mounted on a mount surface 3a of the mount portion 3. The mount portion 3 also serves as a heat sink for dissipating heat generated from the semiconductor chip 7. The surface of the mount portion 3 which is opposite to the mount surface 3a thereof serves as a heat dissipation surface 3b.

The lead frame 1 is fixed between a preheated upper mold 9 and a preheated lower mold 11. Both the upper and lower molds are substantially bilaterally symmetrical. A plurality of upper and lower molds 9, 11 and a plurality of lead frames 1 extend in such a way as to be perpendicular to the sheet of the drawing, so that a plurality of semiconductor devices may be simultaneously plastic-encapsulated. A resin for encapsulation is injected from a runner 13. The injected resin flows in the right and left directions and is used to fill cavities 13a and 13b, through gates 15. In this case, the resin flows at the identical speed in the cavity 13a on the side of the mount surface 3a of the mount portion 3 and the cavity 13b on the side of the heat dissipation surface 3b thereof. However, in general, cavity 13b is narrower than cavity 13a. This is because the thickness of the resin on the heat dissipation surface 3b of the mount portion 3 must be made as thin as possible to improve the heat dissipation effect. Therefore, cavity 13a has a different resistance to the flow of the resin than that of cavity 13b. The resistance to the flow of the resin in cavity 13a is lower than that in cavity 13b. For this reason, the flow velocity of the resin in cavity 13b is decreased. The resin may occasionally be solidified in cavity 13b. However, since the resistance to the flow of the resin in cavity 13a is low, the resin may smoothly flow therein. As a result, after cavity 13a is filled with the resin, it flows into cavity 13b. For this reason, cavity 13b is filled with resin, which flows in the direction indicated by arrow 15b (FIG. 2); and is also filled with resin flowing in the direction shown by arrow 15c, after cavity 13a is filled. However, according to this filling method, bubbles 17 are formed at portions wherein the resin flowing in direction (15b) meets the resin flowing in direction (15c). In extreme cases, non-filled portions remain. So pinholes or holes may be formed in the package of a semiconductor device encapsulated by the above-described method. Furthermore, the package has a non-uniform thickness. This becomes disadvantageous in protecting the device from humidity and an impurity and in electrical insulation of the mount portion 3 of the lead frame 1. In addition to these disadvantages, the yield of the semiconductor devices is decreased. To solve these problems, cavity 13b may be so enlarged as to have the same size as cavity 13a. However, the resin layer on the heat dissipation surface 3b of the mount portion 3 of the lead frame 1 must be thin, in favor of effective heat dissipation. Therefore, according to the conventional method of plastic encapsulation of the semiconductor device, contradictory problems arise, which are difficult to solve, in that the cavity 13b must be narrow to improve the heat dissipation effect; a narrow cavity 13b is difficult to completely fill with resin, without forming bubbles; and a high manufacturing yield must be maintained. According to the conventional semiconductor device manufacturing method, it is difficult to decrease the thickness of the resin layer on the heat dissipation surface, to improve the heat dissipation effect and obtain a package of uniform thickness, without the appearance of pinholes and holes.

To solve the above problems, an improved plastic encapsulation method has been proposed. As shown in FIG. 3, a dam-like portion 19 is formed in a cavity 21a of the mold which is located on the side of a semiconductor chip 7. Therefore, cavity 21a and cavity 21b have the same resistance to the flows of the resin used for encapsulation, as indicated by the arrows. However, according to this method, the design of the package of the semiconductor device must be modified, resulting in a design limitation. Furthermore, since a special mold must be formed, the conventional mold cannot be used, resulting in inconvenience.

SUMMARY OF THE INVENTION

Since the present invention has been contrived to solve the above conventional problems, one of its objects is to provide a semiconductor device wherein the thickness of the sealing resin layer on the heat dissipation surface of a lead frame is decreased, to improve the heat dissipation effect, and the package thereof has a uniform thickness, without pinholes or the like; and wherein the design of the package is not restricted. Another object of the present invention is to provide a method for manufacturing the semiconductor device described above, wherein bubbles are not formed in the cavity after plastic encapsulation, and a portion is not formed which is not filled.

According to one aspect of the present invention, a semiconductor device is provided, which comprises: a lead frame having a mount portion and a lead portion; a semiconductor chip mounted on one major surface of said mount portion, which surface is defined as a mount surface; means for electrically connecting said semiconductor chip to said lead portion; an electrical insulating layer formed on the other major surface of said mount portion, which surface serves as a heat dissipating surface; and an insulating member for sealing said mount portion of said lead frame, part of said lead portion of said lead frame, said semiconductor chip, and said electrical connecting means, excluding a surface of said electrical insulating layer of said mount portion of said lead frame.

According to another aspect of the present invention, a method is provided for manufacturing a semiconductor device, comprising the steps of: forming a lead frame having a lead portion, and a mount portion, one major surface of which mount portion serves as a heat dissipation surface and is covered with an electrical insulating layer; mounting a semiconductor chip on the other major surface, which surface serves as a mount surface of said mount portion of said lead frame obtained in the step of forming a lead frame; electrically connecting, via connecting means, said semiconductor chip to said lead portion of said lead frame which is obtained in the step of forming a lead frame; and sealing with an electrically insulating member said mount portion of said lead frame, part of said lead portion of said lead frame, said semiconductor chip and said electrical connecting means, excluding a surface of said electrical insulating layer of said mount portion of said lead frame which is obtained in the step of forming a lead frame.

According to the semiconductor device having the construction described above, the electrical insulating layer on the heat dissipation surface of the mount portion of the lead frame may be a uniformly thin layer which does not have pinholes or the like, thus allowing for the complete performance of plastic encapsulation. In this manner, the electrically insulating layer can be sufficiently thin, so that the heat dissipation effect may be improved. Therefore, a semiconductor device having a higher power level (i.e., a greater amount of heat being dissipated therefrom) may be prepared when the size of the semiconductor device is predetermined. In addition to this advantage, since the shape of the package need not be modified, no restriction is imposed on package design. According to the present method for manufacturing the semiconductor device, neither air bubbles will be formed nor will non-filled portions remain. Moreover, since the thickness of the resin layer on the heat dissipation surface of the mount need not be adjusted by the mold, as previously described, the electrical insulating layer can be made sufficiently thin. Furthermore, a conventional mold having no dam-like portion can be used for plastic encapsulation.

BRIEF DESCRIPTION OF THE DRAWINGS

FIG. 6(a) is a front view of the heat dissipation surface side of the lead frame which has an electrical insulating layer thereon;

FIG. 6(b) is a sectional view of the lead frame shown in FIG. 6(a), taken along line Y—Y' thereof;

FIG. 7(a) is a front view showing the mount surface side of the lead frame (FIG. 5(b), wherein a semiconductor chip is mounted and wire bonding is performed;

FIG. 7(b) is a sectional view of the lead frame shown in FIG. 7(a), taken along line Z—Z' thereof.

FIG. 8(a) is a front view of the lead frame (FIGS. 7(a) to 7(c) which is plastic-encapsulated;

FIG. 8(b) is a sectional view of the lead frame shown in FIG. 8(a), taken along line W—W' thereof; and FIG. 9 is a partially cutaway perspective view of a lead frame formation material according to another embodiment of the present invention.

DETAILED DESCRIPTION OF THE PREFERRED EMBODIMENTS

Figure 4:
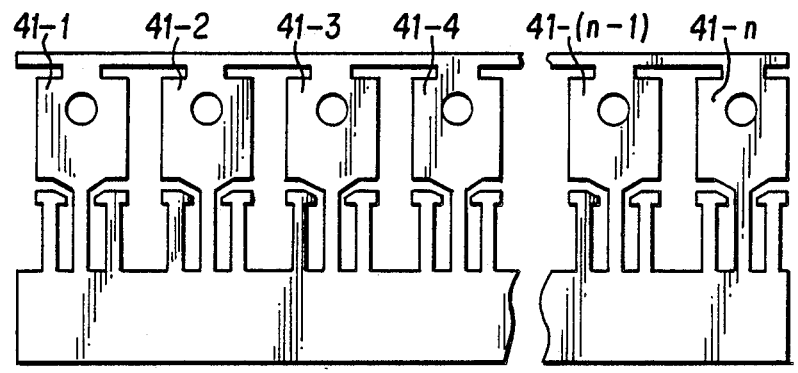
FIG. 4 is a front view of a lead frame strip used in an embodiment of the present invention.
Figure 5A:
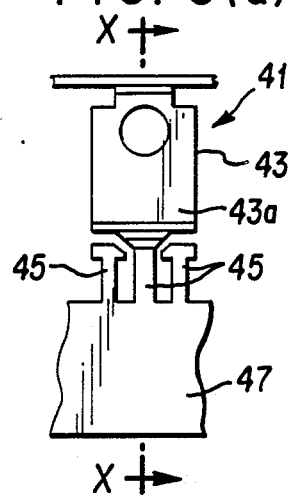
FIG. 5(a) is a front view showing the heat dissipation surface side of one lead frame of the lead frame strip shown in FIG. 4.
Figure 5B:
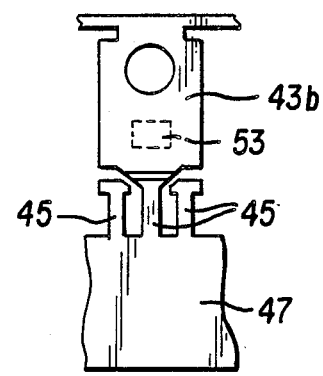
FIG. 5(b) is a front view showing the mount surface side of one lead frame of FIG. 5(a)
Figure 5C:
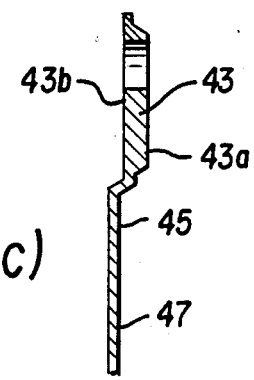
FIG. 5(c) is a sectional view of one lead frame shown in FIG. 5(a), taken along line X—X' thereof.

One embodiment of the present invention may be described as follows, with reference to FIGS. 4 to 8(b). This embodiment illustrates a case wherein a method for manufacturing a semiconductor device is applied to a plastic encapsulated isolation power transistor. FIG. 4 shows a lead frame strip having a plurality of lead frames 41-1, 41-2, ..., and 41-n. Each of the lead frames 41-1, 41-2, ..., and 41-n is constructed as shown in FIGS. 5(a) to 5(c). The lead frame 41 comprises: a mount portion 43 on which a pellet is to be mounted; a lead portion 45; and a connecting portion 47 for connecting the lead frames 41-1, 41-2, ... and 41-n. The mount portion 43 serves as a heat sink to dissipate outside heat generated from the semiconductor chip. One major surface of the mount portion 43, which is opposite to the other major surface having the semiconductor chip mounted thereon, is defined as a heat dissipation surface 43a; and the other major surface is defined as a mount surface 43b.

Figure 1:
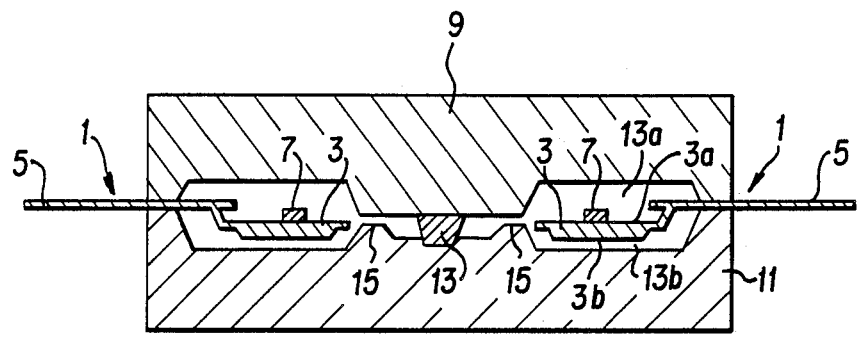
FIGS. 1 and 2 are sectional views for use in explaining a conventional plastic encapsulation method.
Figure 2:
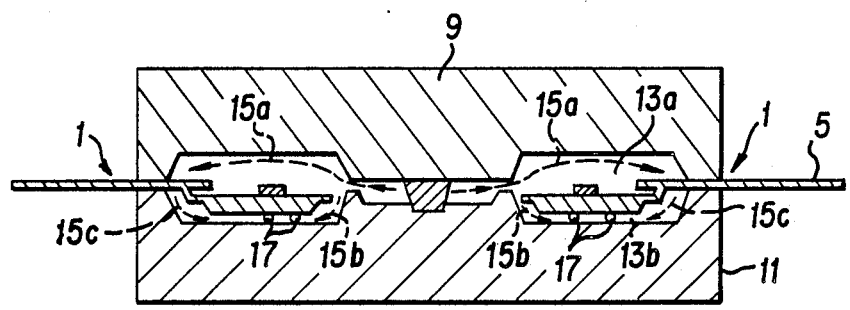
Figure 3:
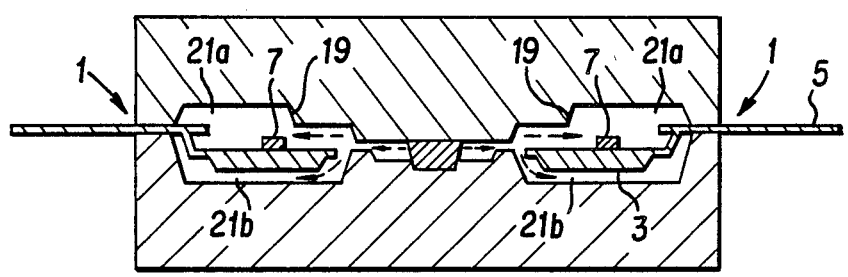
FIG. 3 is a sectional view for use in explaining another conventional plastic encapsulation method which represents an improvement over that shown in FIGS. 1 and 2.

The heat dissipation surface 43a of the mount portion 43 is coated with an epoxy resin, as shown in the hatched portion of FIGS. 6(a). The thickness of the epoxy resin layer 51 is coated within a range of between 0.1 mm and 0.4 mm. The epoxy resin layer 51 may be formed in such a way that a noncured resin (B state) is applied to the heat dissipation surface 43a of the lead frame 41 and is cured. However, in this embodiment, an epoxy resin sheet having a predetermined thickness and a predetermined size can be adhered to the heat dissipation surface 43a and then be cured. In this case, the thickness of the substantially solid epoxy resin layer 51 shown in FIG. 7(b) may be arbitrarily determined with ease. The front view of the mount surface of the lead frame 41 which has the epoxy resin layer 51 is the same as that in FIG. 5(b). Thereafter, a semiconductor chip 55 is mounted on a prospective semiconductor chip mount region 53 of the mount surface 43b of the lead frame 41 (FIG. 5(b), as shown in FIGS. 7(a) and 7(b). The mounted semiconductor chip 55 is connected to the lead portion 45 of the lead frame 41 by a thin wire 57, such as an Au or Al wire. After the semiconductor chip 55 has been mounted and wire bonding has been preformed, the heat dissipation surface of the lead frame 41 has the same construction as that shown in FIG. 6(a). The resultant lead frame 41 is mounted in the molds shown in FIG. 1. In this case, the epoxy resin layer 51 on the heat dissipation surface 43a is brought into tight or close contact with the opposing inner surfaces of the molds. Subsequently, in the same manner as in the conventional method, the sealing resin is used to fill the cavities of the molds. Excluding the epoxy resin layer 51 on the heat dissipation surface 43a, the portion to be exposed outside of the package of the lead portion 45, and the connecting portion 47, the lead frame 41 and semiconductor chip 55, and the thin wire 57 is encapsulated. In other words, the semiconductor chip 55, the thin wire 57 for wire bonding, the mount surface 43b of the mount portion 43 of the lead frame 41, its side portion, and a portion of the lead portion 45 which is connected to the wire 57 are sealed or encapsulated with the resin. The sealing resin constitutes a package 59. The front view and the sectional view along line W—W' of the plastic encapsulated semiconductor device are illustrated in FIGS. 8(a) and 8(b), respectively. Thereafter, the connecting portion 47 of the lead frame 41 is pressed, as needed, as indicated by the broken lines of FIG. 8(a). Thus, semiconductor devices are prepared. Each semiconductor device comprises a lead frame 41; the epoxy resin layer 51 formed on the heat dissipation surface 43a; the semiconductor chip 55 mounted on the mount surface 43b; a bonding wire 57; and a sealing resin of the package 59, for sealing those portions of the semiconductor device excluding a part of the lead portion 45 and the surface of the epoxy resin layer 51.

In the semiconductor device thus obtained, heat is generated from the semiconductor chip 55, while the device is being operated. The heat must be dissipated through the lead frame 41 and the resin of the package 59. The heat generated by this semiconductor device is mostly dissipated from the heat dissipation surface 43a of the mount portion 43 as a heat sink through the electrical insulating layer 51. The thin layer 51 provides the good dissipation effect. Furthermore, since the mount portion 43 is insulated, the device mount location and the contact (short circuit) between this device and any other device need not be considered. The semiconductor device of the present invention may be used in the same manner as the conventional plastic encapsulated semiconductor device.

In the above embodiment, the epoxy resin layer 51 is adhered to the heat dissipation surface 43a, after the lead frame 41 is formed, to obtain a lead frame having the heat dissipation surface 43a covered with the epoxy resin layer 51. However, the present invention is not limited to this method of preparing the lead frame. For example, as shown in FIG. 9, epoxy resin layers 83 are applied by the doctor blade method to specific regions of an alloy sheet 81 for the lead frame 41, in a stripe manner. Thereafter, the epoxy resin is cured. Alternatively, the noncured epoxy resin may be adhered to the specific portions, and can be cured thereafter. The alloy sheet 81 is pressed in the manner indicated by the broken lines of FIG. 9. As a result, the lead frame 41 having the epoxy resin layer 51 formed on the heat dissipation surface 43a is prepared, as shown in FIG. 6(a), FIG. 6(b). The regions which have stripes of the epoxy resin layer 83 include the portion on which the heat dissipation surface 43a is formed when the alloy sheet 81 is pressed to form the lead frame 41, as indicated by the broken line in FIG. 9. The present invention is not limited to the epoxy resin formation methods wherein the epoxy resin layers 83 are applied in a stripe manner or are adhered to the alloy sheet. For example, the epoxy resin may be applied or adhered to the prospective heat dissipation surface region 43a of the lead frame 41.

The material of the lead frame 41 is not limited to the specific material cited, since Fe, Cu or Al-type materials may generally be used.

In the above embodiment, the electrical insulating layer formed on the heat dissipation surface 43a of the lead frame 41 comprises an epoxy resin layer having a thickness of from 0.1 to 0.4 mm. However, the present invention is not limited to this construction. For example, a silicone resin and a phenol resin may be used as the material of the electrical insulating layer. Furthermore, the thickness of the electrical insulating layer can be determined in accordance with the amount of heat generated from the semiconductor device, its power, its resistance to corrosion and its insulation properties. In particular, when aluminum is used as the material of the lead frame and, hence, of the heat dissipation surface 43a, the aluminum may be oxidized, and the aluminum oxide layer which is formed may be used as the electrical insulating layer 51 on the heat dissipation surface 43a.

Moreover, the sealing resin used is not limited to a particular resin, but may be extended to any general resin.

What is claimed is:

1. A method for manufacturing a semiconductor device, which comprises the steps of:
    forming a lead frame having a mount portion and a lead portion connected to said mount portion, whereby said mount portion includes a mount surface and a heat dissipation surface, such that said mount surface and said heat dissipation surface face substantially opposite directions along said lead frame;
    mounting a semiconductor chip on said mount surface;
    electrically connecting said semiconductor chip to said lead portion;
    forming an electrical insulation layer on said heat dissipation surface for dissipating most of the heat generated by said semiconductor chip; and
    encapsulating said mount surface, said semiconductor chip, and said lead portion proximate said mount portion with a resin layer, so that said resin layer abuts said insulation layer.

2. The method recited in claim 1, wherein said step of forming said electrical insulation layer includes forming said insulation layer between about 0.1 mm and about 0.4 mm in thickness.

* * * * *